United States Patent [19]

Kirkpatrick

[11] Patent Number: 5,334,881

[45] Date of Patent: Aug. 2, 1994

[54] HIGH ISOLATION ELECTRONIC SWITCH

[75] Inventor: Thomas I. Kirkpatrick, La Jolla, Calif.

[73] Assignee: The United States of America as represented by the Secretary of the Navy, Washington, D.C.

[21] Appl. No.: 854,112

[22] Filed: Mar. 19, 1992

[51] Int. Cl.$^5$ .................. H03K 17/56; H03K 17/687; H03K 3/01

[52] U.S. Cl. ................................ 307/241; 307/243; 307/571; 307/573; 328/61

[58] Field of Search ............... 307/241, 242, 243, 571, 307/573; 328/104, 154, 163, 61

[56] References Cited

U.S. PATENT DOCUMENTS

| | | | |
|---|---|---|---|
| 4,204,131 | 5/1980 | Dozier | 307/241 |
| 4,551,634 | 11/1985 | Takahashi et al. | 307/241 |
| 4,733,203 | 3/1988 | Ayasli | 307/242 |
| 5,032,739 | 7/1991 | Koh | 307/243 |
| 5,166,540 | 11/1992 | Park | 307/241 |

*Primary Examiner*—William L. Sikes
*Assistant Examiner*—Trong Phan
*Attorney, Agent, or Firm*—Harvey Fendelman; Thomas Glenn Keough

[57] ABSTRACT

A high isolation electronic switch is provided for selectively switching an output line between first and second input lines. Each input line is connected to a respective circuit that has a first current carrying path to connect the respective input line to the output line, and a second current carrying path to connect a portion of the first current carrying path of the respective circuit to a ground potential. Each respective circuit is further selectively operated to conduct along only one of its first or second current carrying paths. A unity gain buffer is connected serially in the first current carrying path of each respective circuit. The switch is selectively operated such that one circuit conducts along its first current carrying path when the other circuit is conducting along its second current carrying path. A fixed impedance is connected between the output line and ground potential to minimize effects of conducting resistance when the first or second circuits are selectively operated to conduct along their respective first current carrying path, and to minimize capacitive leakage when the first or second circuits are selectively operated to conduct along their second current carrying path. A third unity gain buffer is connected serially in the output line to isolate the fixed impedance from the effects of a load connected to the output line.

8 Claims, 2 Drawing Sheets

HIGH ISOLATION ELECTRONIC SWITCH

STATEMENT OF GOVERNMENT INTEREST

The invention described herein may be manufactured and used by or for the Government of the United States for governmental purposes without the payment of any royalties thereon or therefor.

FIELD OF THE INVENTION

The present invention relates to the field of electronic switches, and more particularly to a high isolation electronic switch for selectively switching a loaded output line between first and second signal input lines.

BACKGROUND OF THE INVENTION

Integrated circuit switches are used to selectively switch an output between two or more inputs while preventing the non-selected inputs from being unintentionally fed through (to the output) by stray capacitance or other leakage. These switches have been traditionally designed for maximum signal isolation for specific driving circuits and specific output loads. Therefore, the prior art integrated circuit switches are generally limited to particular load impedance values and are not operable with, or adaptable to, a range of load impedances. Accordingly, a need exists in the art for a high isolation electronic switch that can operate irrespective of the impedance of the driven load. In this way, the switch can be utilized as an off-the-shelf "plug-in" for a variety of switch applications, i.e. load impedances. Naturally, as in all integrated circuit designs, this task must be accomplished at a low cost.

Accordingly, an object of the present invention is to provide a high isolation electronic switch that functions irrespective of the impedance of the driving circuits and the impedance of the load to be driven. Another object of the present invention is to provide a high isolation electronic switch capable of isolating a signal output line from stray capacitance/leakage due to any non-selected signal input(s) for a variety of load impedances. Still another object of the present invention is to provide a high isolation electronic switch design that is cost efficient.

SUMMARY OF THE INVENTION

A high isolation electronic switch for selectively switching an output line between first and second signal input lines is provided. A first circuit has a first current carrying path to connect the first signal input line to the output line, and a second current carrying path to connect a portion of the first current carrying path of the first circuit to a ground potential. The first circuit is further selectively operated to conduct along only one of its first or second current carrying paths. A first unity gain buffer is connected serially in the first current carrying path of the first circuit. A second circuit has a first current carrying path to connect the second signal input line to the output line, and a second current carrying path to connect a portion of the first current carrying path of the second circuit to a ground potential. The second circuit is further selectively operated to conduct: 1) along its first current carrying path when the first circuit is conducting along its second current carrying path, and 2) along its second current carrying path when the first circuit is conducting along its first current carrying path. A second unity gain buffer is connected serially in the first current carrying path of the second circuit. A fixed impedance is connected between the output line and ground potential. The fixed impedance minimizes effects of conducting resistance when the first or second circuits are selectively operated to conduct along their respective first current carrying path, and minimizes effects of capacitive leakage when the first or second circuits are selectively operated to conduct along their second current carrying path. A third unity gain buffer is connected serially in the output line to isolate the fixed impedance from the effects of a load connected to the output line.

DESCRIPTION OF THE PREFERRED EMBODIMENT

Figure 1:
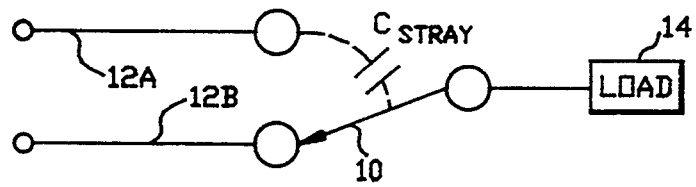
FIG. 1 is a schematic of a prior art single-pole, double-throw switch.

Referring now to the drawings, and in particular to FIG. 1, a prior art single-pole, double-throw (SPDT) switch 10 is shown to illustrate the problem solved by the present invention. In particular, switch 10 connects one of two input lines 12A or 12B to a load 14. As shown, there is typically stray capacitance $C_{STRAY}$ which couples a small amount of signal from input line 12A even when switch 10 is connected to input line 12B. While a variety of prior art switch configurations have been developed to combat this problem, none have been able to function for a variety of applications where the impedance of load 14 varies from application to application.

Figure 2:
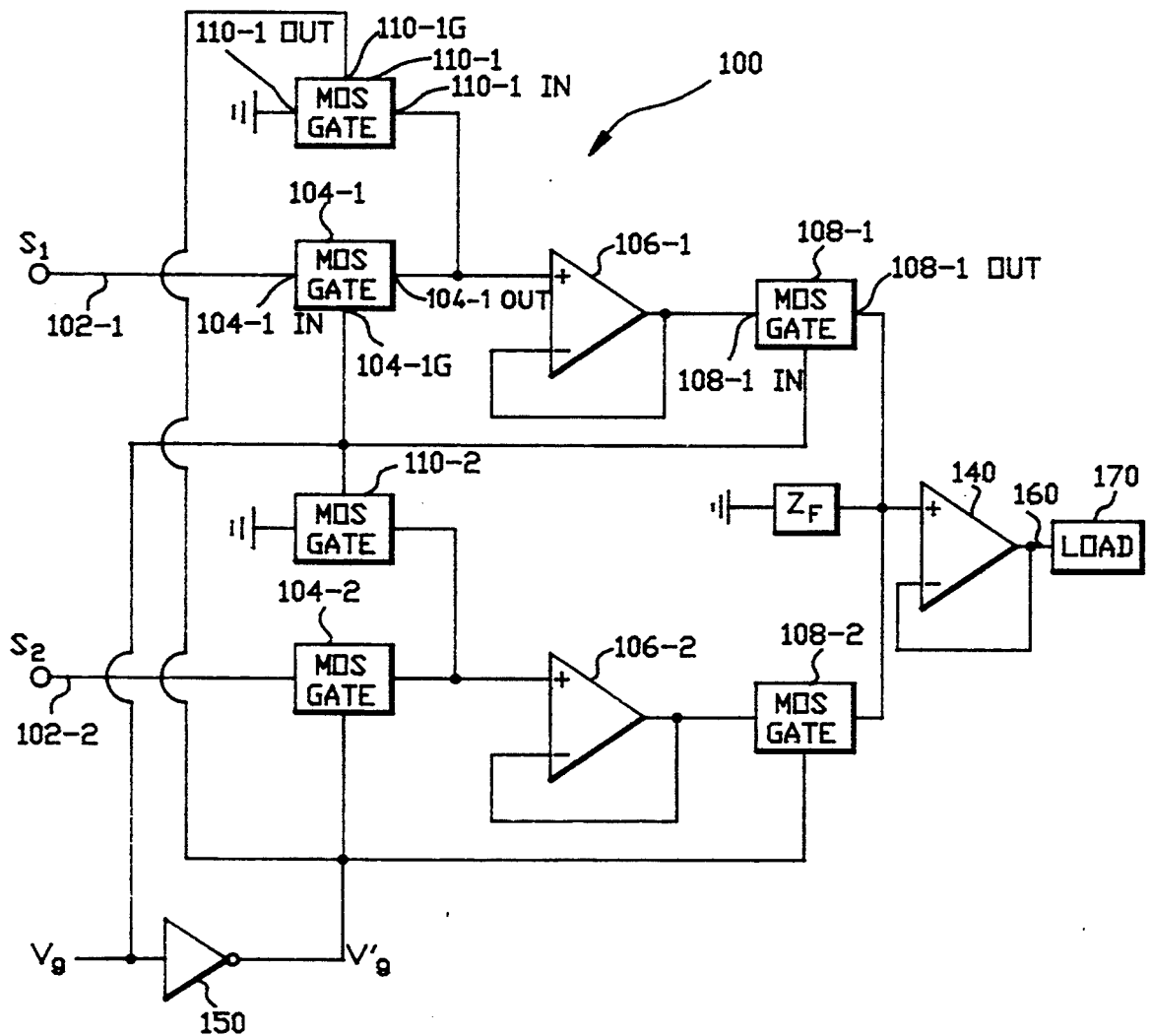
FIG. 2 is a schematic of the high isolation electronic switch according to the present invention for selectively switching between two signal input lines.

In FIG. 2, a schematic of the high isolation electronic switch according to the present invention is referenced generally by numeral 100. It is to be understood at the outset that while the present invention will be described for selectively switching an output line between one of two input lines, it is not so limited. Indeed, the novel features of the present invention may be duplicated to allow selection between a multiplicity of input lines as will be explained further hereinbelow.

In switch 100, a metal-oxide-semiconductor (MOS) gate 104-1 receives, at its input port 104-1IN, a signal $S_1$ on signal input line 102-1. At its gate port 104-1G, MOS gate 104-1 receives a control voltage signal $V_g$. MOS gate 104-1 is selectively made active or conducting by application of control voltage $V_g$. For example, a "high" control voltage allows MOS gate 104-1 to conduct current from its input port 104-1IN to its output port 104-1OUT. Conversely, a "low" control voltage inhibits conduction by MOS gate 104-1 thereby causing an open circuit in the conduction path of MOS gate 104-1 between its respective input and output ports 104-1IN and 104-1OUT.

The output 104-1OUT of MOS gate 104-1 serves as the input to a MOS gate 110-1 and to the non-inverting input of an operational amplifier 106-1. MOS gate 110-1 operates in the same fashion as MOS gate 104-1 but is configured such that its output port 110-1OUT is connected to ground potential. In addition, gate port 110-1G is configured to receive the opposite control voltage (or $V_g'$) received by MOS gate 104-1. One way of achieving this is to provide an inverter 150 to generate $V_g'$ from $V_g$.

The inverting input of operational amplifier 106-1 is shorted to its output. Configured as such, operational amplifier 106-1 serves as a unity gain buffer that isolates signal input line 102-1 from any effects of a fixed impedance $Z_F$ whose function will be explained further herein below. Another important function of unity gain buffer 106-1 is to isolate the fixed impedance $Z_F$ from the effects of the conducting or "ON" resistance of MOS gate 104-1 and, even more importantly, the impedance of the signal source (not shown) driving input line 102-1. If buffer 106-1 were not present, a voltage divider effect could produce an unintended reduction in signal voltage at the switch's output line 160 which serves as the input to a driven load 170.

The output of buffer 106-1 is input to the input port 108-1IN of MOS gate 108-1. Configured to match MOS gate 104-1, MOS gate 108-1 receives the same control voltage $V_g$ and thus will conduct (or inhibit) current flow in unison with MOS gate 104-1. In this way, when $V_g$ is "high", the signal on input line 102-1 is selectively conducted through MOS gate 104-1, buffer 106-1 and MOS gate 108-1 while the path to ground potential through MOS gate 110-1 is open. Conversely, when $V_g$ is "low", MOS gates 104-1 and 108-1 inhibit current flow while MOS gate 110-1 is configured to conduct to ground potential. Thus, any stray capacitance/leakage from input line 102-1 across MOS gate 104-1 is shorted to ground. In an operatively opposite fashion, input line 102-2 is the non-selected input line when control voltage $V_g$ is "high" since MOS gate 104-2 and MOS gate 108-2 are in an inhibited state. Conversely, input line 102-2 is made the selected input line (while input line 102-1 becomes non-selected) by supplying a control voltage $V_g$ that is "low".

As mentioned above, buffers 106-1 and 106-2 perform the function of isolating the impedance of respective signal input lines 102-1 and 102-2 from the provided fixed impedance $Z_F$ when the respective signal input lines are the selected input lines based on the control voltage $V_g$. In the ideal circuit, the fixed impedance $Z_F$ is minimized to reduce the possible amount of feedthrough leakage from a non-selected input line. However, minimizing $Z_F$ increases the effect of the ON resistance of MOS gates 108-1 and 108-2, and particularly variations in such resistance. This resistance is sufficient to create a voltage divider effect thereby reducing the signal voltage on output line 160. To minimize this effect and its variability, $Z_F$ should be as large as needed to meet any output voltage tolerances. However, the value of $Z_F$ must still be low enough to prevent stray capacitance from causing unintended feedthrough. Accordingly, in a practical circuit, the value of $Z_F$ is finite and reasonably low, i.e. On the order of tens of kilo-ohms. Note that if $Z_F$ is too large, i.e. mega-ohms, even a small amount of capacitive leakage across a MOS gate can couple a significant amount of the signal on the non-selected input line through to the output.

Referring again to FIG. 2, an operational amplifier unity gain buffer 140 is provided in the output line 160 between $Z_F$ and load 170. This allows switch 100 to drive load 170 even when it is a low impedance load, i.e. one or two orders of magnitude less than the typical aforementioned values of $Z_F$. Most conventional MOS gates have a finite channel impedance of a few hundred ohms. Thus, without buffer 140, load 170 would combine in parallel with fixed impedance $Z_F$. As explained above, a low external load impedance in parallel with $Z_F$ would produce a reduction in output voltage on output line 160. By connecting the operational amplifier buffer 140 as shown, the effects of fixed impedance $Z_F$ on circuit performance can be predicted even for a low impedance load 170.

The advantages of the present invention are numerous. A high isolation electronic switch has been designed that: 1) prevents stray capacitance/leakage from a non-selected input line, 2) is unaffected by the impedance of the driving circuits, and 3) is unaffected by the impedance of the load to be driven. Thus, the switch of the present invention will find great utility in a wide variety of applications thereby obviating the need for circuit-specific switch designs. The switch is further designed to be assembled with current and future off-the-shelf technology. As such, the design of the present invention could be built to suit a wide variety of budgets.

Figure 3:
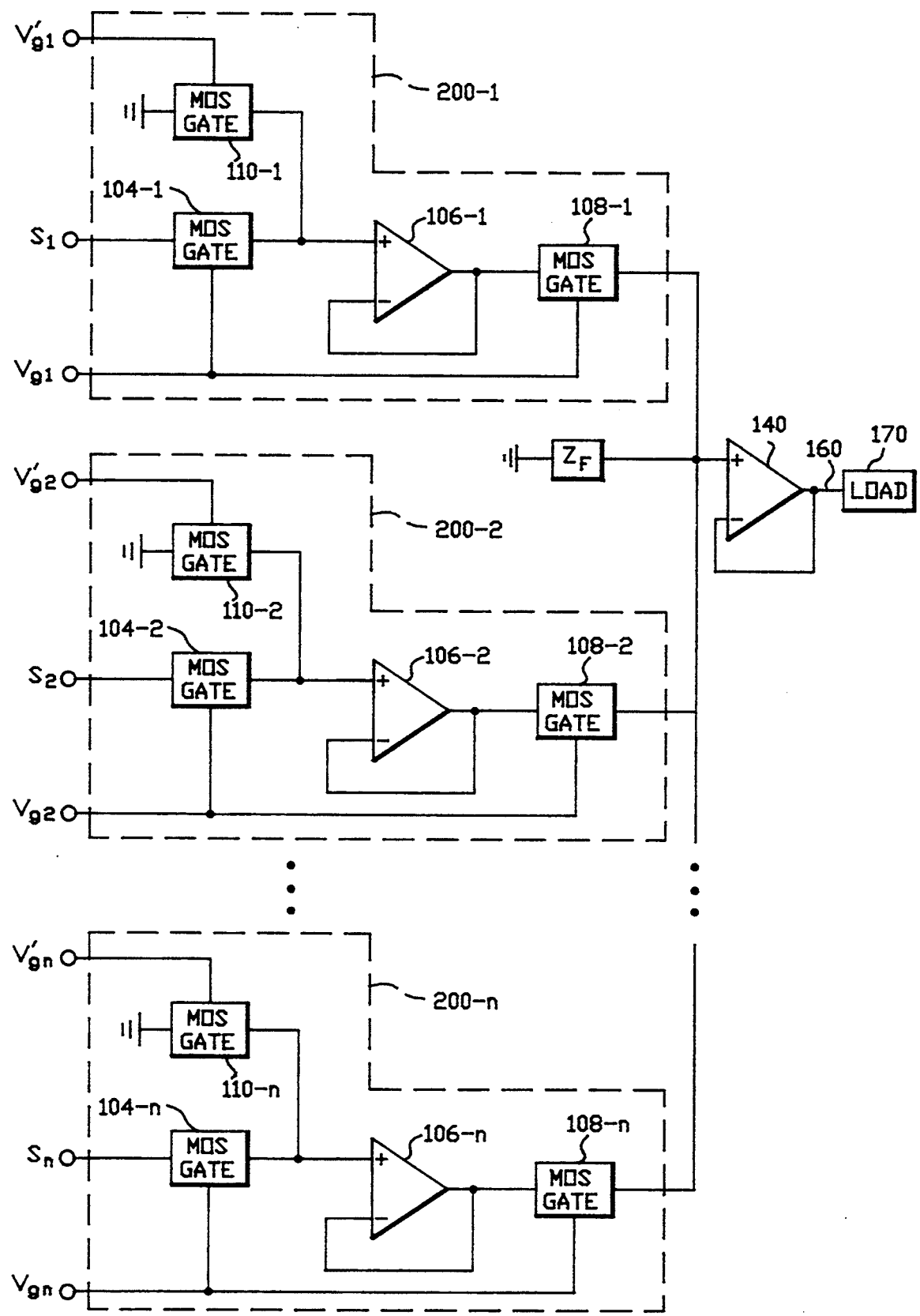
FIG. 3 is a schematic of another embodiment of the high isolation electronic switch of the present invention configured to select a single input line from a multiplicity of input lines.

Although the invention has been described relative to a specific embodiment thereof, there are numerous variations and modifications that will be readily apparent to those skilled in the art in the light of the above teachings. It is therefore to be understood that, within the scope of the appended claims, the invention may be practiced other than as specifically described. For example, the teachings of the present invention may be extended to a switch that handles substantially larger number of signal input lines or channels. One such switch is shown schematically in FIG. 3 where each signal input $S_1, S_2, \ldots, S_n$ is fed to a respective MOS gate circuit 200-1, 200-2, $\ldots$, 200-n. The components and configuration of each circuit are identical to those shown and described for either of the signal input lines in FIG. 2. Accordingly, like reference numerals have been used where appropriate. Each circuit is further supplied with a control voltage $V_{g1}, V_{g2}, \ldots, V_{gn}$ and inverses thereof. In this way, the circuits can be controlled such that only one circuit is selected to conduct its signal input through to the output at any one time. Once again, an output buffer 140 is provided to allow operation of the switch when load 170 is a low impedance load.

What is claimed as new and desired to be secured by Letters Patent of the United States is:

1. A high isolation electronic switch for selectively switching an output line between first and second signal input lines, comprising:

a first circuit having a first current carrying path connecting the first signal input line to the output line and a second current carrying path connecting a portion of the first current carrying path of said first circuit to a ground potential, wherein said first circuit is selectively operated to conduct along only one of its first or second current carrying paths;

a first unity gain buffer connected serially in the first current carrying path of said first circuit;

a second circuit having a first current carrying path connecting the second signal input line to the output line and a second current carrying path connecting a portion of the first current carrying path of said second circuit to a ground potential, wherein said second circuit is selectively operated to conduct along its first current carrying path when said first circuit is conducting along its second current carrying path, and along its second current carrying path when said first circuit is conducting along its first current carrying path;

a second unity gain buffer connected serially in the first current carrying path of said second circuit;

a fixed impedance connected between the output line and ground potential for minimizing effects of conducting resistance when said first or second circuits are selectively operated to conduct along their respective first current carrying path, and for minimizing effects of capacitive leakage when said first or second circuits are selectively operated to conduct along their second current carrying path; and a third unity gain buffer connected serially in the output line for isolating said fixed impedance from effects of a load connected to the output line.

2. An electronic switch as in claim 1 wherein each of said first, second and third unity gain buffers is an operational amplifier.

3. A high isolation electronic MOS gate switch for selectively switching a load between first and second signal input lines, comprising:

a first MOS gate having a conducting path with a first end connected to the first signal input line, and having a second end;

a first unity gain buffer having an input connected to the second end of said first MOS gate, and having an output;

a second MOS gate having a conducting path with a first end connected to the output of said first unity gain buffer and having a second end connected to a common connection point;

a third MOS gate having a conducting path with a first end connected to the second end of said first MOS gate and the input of said first unity gain buffer and having a second end connected to ground potential;

a fourth MOS gate having a conducting path with a first end connected to the second signal input line, and having a second end;

a second unity gain buffer having an input connected to the second end of said fourth MOS gate, and having an output;

a fifth MOS gate having a conducting path with a first end connected to the output of said second unity gain buffer and having a second end connected to the common connection point;

a sixth MOS gate having a conducting path with a first end connected to the second end of said fourth MOS gate and the input of said second unity gain buffer and having a second end connected to ground potential;

a fixed impedance connected between the common connection point and ground potential;

a third unity gain buffer connected between the common connection point and the load; and means for supplying a first or second control voltage to a gate port of each of said first, second, third, fourth, fifth and sixth MOS gates, wherein the first control voltage permits conduction by a MOS gate along its conduction path and the second control voltage inhibits conduction by the MOS gate along its conduction path, and wherein the first signal input line is selectively connected to the load when the gate ports of said first, second and sixth MOS gates receive the first control voltage while the gate ports of said third, fourth and fifth MOS gates receive the second control voltage, and wherein the second signal input line is selectively connected to the load when the gate ports of said first, second and sixth MOS gates receive the second control voltage while the gate ports of said third, fourth and fifth MOS gates receive the first control voltage.

4. An electronic switch as in claim 3 wherein each of said first, second and third unity gain buffer is an operational amplifier.

5. An electronic switch as in claim 3 further comprising means for inverting the first control voltage to generate the second control voltage.

6. An apparatus for electronically switching an output line between a plurality of channels, one of the channels being selectively activated to pass an input signal thereon to the output line while the remaining channels are non-selected, wherein the plurality of channels connect to the output line at a common connection point, comprising:

a circuit for each of the channels, each said circuit having a first current carrying path for transferring the input signal to the output line when the channel is selectively activated, and a second current carrying path for connecting a portion of the first current carrying path to a ground potential when the channel is non-selected, wherein each said circuit is selectively operated to conduct along only one of its first or second current carrying paths;

unity gain buffer means for each of the channels connected serially in the first current carrying path of each said circuit for isolating the output line from the input signal when said circuit is selectively conducting along its first current carrying path;

a fixed impedance connected between the common connection point and ground potential; and means connected serially in the output line for minimizing effects of a load connected to the output line on said fixed impedance.

7. An apparatus as in claim 6 wherein said unity gain buffer means is an operational amplifier.

8. An apparatus as in claim 6 wherein said means for minimizing is an operational amplifier connected as a unity gain buffer.

* * * * *